United States Patent
Fukuda

(10) Patent No.: US 7,256,720 B2
(45) Date of Patent: Aug. 14, 2007

(54) OUTPUT FILTER FOR DELTA SIGMA MODULATOR AND DIGITAL SIGNAL PROCESSOR PROVIDED WITH THE SAME

(75) Inventor: Masakazu Fukuda, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/730,928

(22) Filed: Dec. 10, 2003

(65) Prior Publication Data
US 2004/0233085 A1 Nov. 25, 2004

(30) Foreign Application Priority Data
Dec. 12, 2002 (JP) ............................. 2002-360689

(51) Int. Cl.
*H03M 3/00* (2006.01)
(52) U.S. Cl. ........................ 341/143; 341/144
(58) Field of Classification Search ................ 341/143, 341/144, 118, 120, 131, 161, 152, 136; 375/376
See application file for complete search history.

(56) References Cited
U.S. PATENT DOCUMENTS

| | | | | |
|---|---|---|---|---|
| 4,658,225 A * | 4/1987 | Dukes et al. | ............... | 333/166 |
| 5,323,157 A * | 6/1994 | Ledzius et al. | ............ | 341/143 |
| 5,515,047 A * | 5/1996 | Yamakido et al. | .......... | 341/153 |
| 5,625,357 A * | 4/1997 | Cabler | ........................ | 341/143 |
| 5,638,016 A * | 6/1997 | Eitrheim | ..................... | 327/175 |
| 5,727,038 A * | 3/1998 | May et al. | .................. | 375/376 |
| 6,087,968 A * | 7/2000 | Roza | .......................... | 341/143 |
| 6,529,077 B1 * | 3/2003 | Dasgupta | .................... | 330/254 |
| 6,556,643 B2 * | 4/2003 | Merritt | ........................ | 377/16 |
| 6,795,001 B2 * | 9/2004 | Roza | .......................... | 341/143 |

* cited by examiner

*Primary Examiner*—Rexford Barnie
*Assistant Examiner*—Joseph Lauture
(74) *Attorney, Agent, or Firm*—Sughrue Mion, PLLC

(57) ABSTRACT

The invention intends to reduce noises by resistors in an output filter for a delta sigma modulator. The output filter uses an FIR filter with constant current sources as the current source, extracts output data of the delta sigma modulator from each taps of a shift register, controls MOS transistors by the extracted delayed signals, attains currents weighted according to the FIR filter coefficients corresponding to the number of the taps from the constant current sources, adds the currents attained, and performs the current-to-voltage conversion of the currents thus attained by feedback resistors of a full differential operational amplifier.

6 Claims, 3 Drawing Sheets

OUTPUT FILTER FOR DELTA SIGMA MODULATOR AND DIGITAL SIGNAL PROCESSOR PROVIDED WITH THE SAME

BACKGROUND OF THE INVENTION

1. Field of the Invention

The present invention relates to an output filter (post-filter) for a delta sigma modulator used in a digital signal processor for a mobile telephone, PDA, music reproducing amplifier, etc, and a digital signal processor provided with the same.

2. Description of the Related Art

At the present time, in the field of the digital audio and the like, it is a general exercise to quantize a digital signal of multi-bits into that of one bit by means of a delta sigma modulator, because it simplifies the input/output configuration, saves the number of gates for the computing unit in calculation, and facilitates to build up a simplified system.

The delta sigma modulator allocates low-boosting integrators to the input stage thereof, allocates low-cutting differentiators to the output stage thereof, and unevenly distributes quantized noises to a higher frequency, which brings a noise shaping effect to enhance the S/N ratio in the audio band.

The quantized data ("1" or "0") of one bit, quantized by the delta sigma modulator, are converted into analog signals, which are inputted to the following stage output filter 1. The output filter 1 removes high-frequency noises, and obtains a satisfactory reproduction waveform.

FIG. 2 is a circuit diagram illustrating one example of the output filter (active filter) 1, which converts one-bit-quantized data generated by a digital sigma modulator 2 into analog signals to output, and inputs the output to the active filter 1.

In order to enhance the performance of the delta sigma modulator, it is necessary to raise the degree of a noise-shaping filter used in this modulator. To raise the degree of the filter for that purpose will involve increasing the quantized noises having experienced the noise shaping. To remove the noises requires sharpening the high-frequency cut-off characteristic of the output filter 1 illustrated in FIG. 1, which accompanies to raise the degree of the output filter 1 shown in FIG. 2.

That is, the output filter 1 illustrated in FIG. 2 removes the high-frequency noise components contained in the output data of the delta sigma modulator 2, however this circuit configuration is incapable of sufficiently removing the noise components, unless the degree of the output filter 1 is raised.

However, to raise the degree of the output filter (active filter) 1 will increase the output resistance thereof to that extent, and the resistors will deteriorate the noise level.

In order to improve this situation, there has been a proposal that uses an FIR filter for the output filter to enhance the filter characteristic.

The circuit illustrated in FIG. 3 provides the output filter using an FIR filter in replacement for the output filter (active filter) illustrated in FIG. 2, thereby improving the filter characteristic.

That is, the circuit delays the output data that the delta sigma modulator 2 generates through the digital-to-analog conversion, in accordance with the taps of a shift register S composed of multi-stage flip-flops (F/F) F1, F2, . . . Fn of an FIR filter 4. On the basis of the delayed data, the circuit controls MOS transistors T1, T2, . . . Tn to convert currents into voltages by means of resistors 7a and 7b connected to a current source, attains the voltages weighted according to the FIR filter coefficients, adds these voltages, and outputs the result from an output circuit 5 configured with a LPF.

This circuit includes the FIR filter 4, and it improves the filter characteristic accordingly. However, since the FIR filter 4 takes on a configuration that uses the resistors 7a and 7b as the current source, converts currents into voltages, and attains specified voltages, there arise thermal noises since the currents flow through the resistors 7a and 7b. Besides, the application circuit (attached circuit) of an operational amplifier 5a of the output circuit 5 configured with the LPF has large resistances, and in this part arise significant noises by the resistors. On top of that, since the operational amplifier 5a is incapable of eliminating common mode noises, if the filter characteristic is improved, the noise level is not improved as the whole, which is a problem to be solved.

It is confirmed that there exists a circuit configuration using an FIR filter as the output filter for the delta sigma modulator (see JP 1995-74645A), however there does not exist equivalence to this invention.

SUMMARY OF THE INVENTION

The present invention has been made in view of the conventional problems in case of using an FIR filter for a delta sigma modulator. A first object of the invention is, when the output filter provides the FIR filter, to lower the resistances of the output filter to thereby reduce the thermal noises by resistors.

A second object is to lower the resistances of the output filter by making feedback resistances of an operational amplifier perform the current-to-voltage conversion.

A third object is to remove influences of common mode noises by employing a full differential operational amplifier in the current-to-voltage conversion unit of the output filter.

To achieve the above objects, an output filter for a delta sigma modulator according to a first aspect of the invention comprises an FIR filter that outputs output data of a delta sigma modulator from each of plural delay elements cascaded, controls currents from a current source on the basis of each of the output data to thereby attain currents weighted according to a filter characteristic, and adds the currents to output the result, wherein the current source is a constant current source.

An output filter for a delta sigma modulator according to a second aspect of the invention further comprises, in the first aspect of the invention, a current-to-voltage conversion unit that performs the current-to-voltage conversion by feedback resistors of a full differential operational amplifier, on the output side of the FIR filter.

An output filter for a delta sigma modulator according to a third aspect of the invention further comprises, in the first aspect of the invention, a single differential conversion operational amplifier on the output side of the full differential operational amplifier.

An output filter for a delta sigma modulator according to a fourth aspect of the invention comprises, in the first to third aspect of the invention, an output filter for a delta sigma modulator.

DETAILED DESCRIPTION OF THE PREFERRED EMBODIMENT

The present invention will be described with reference to the accompanying drawings.

Figure 1:
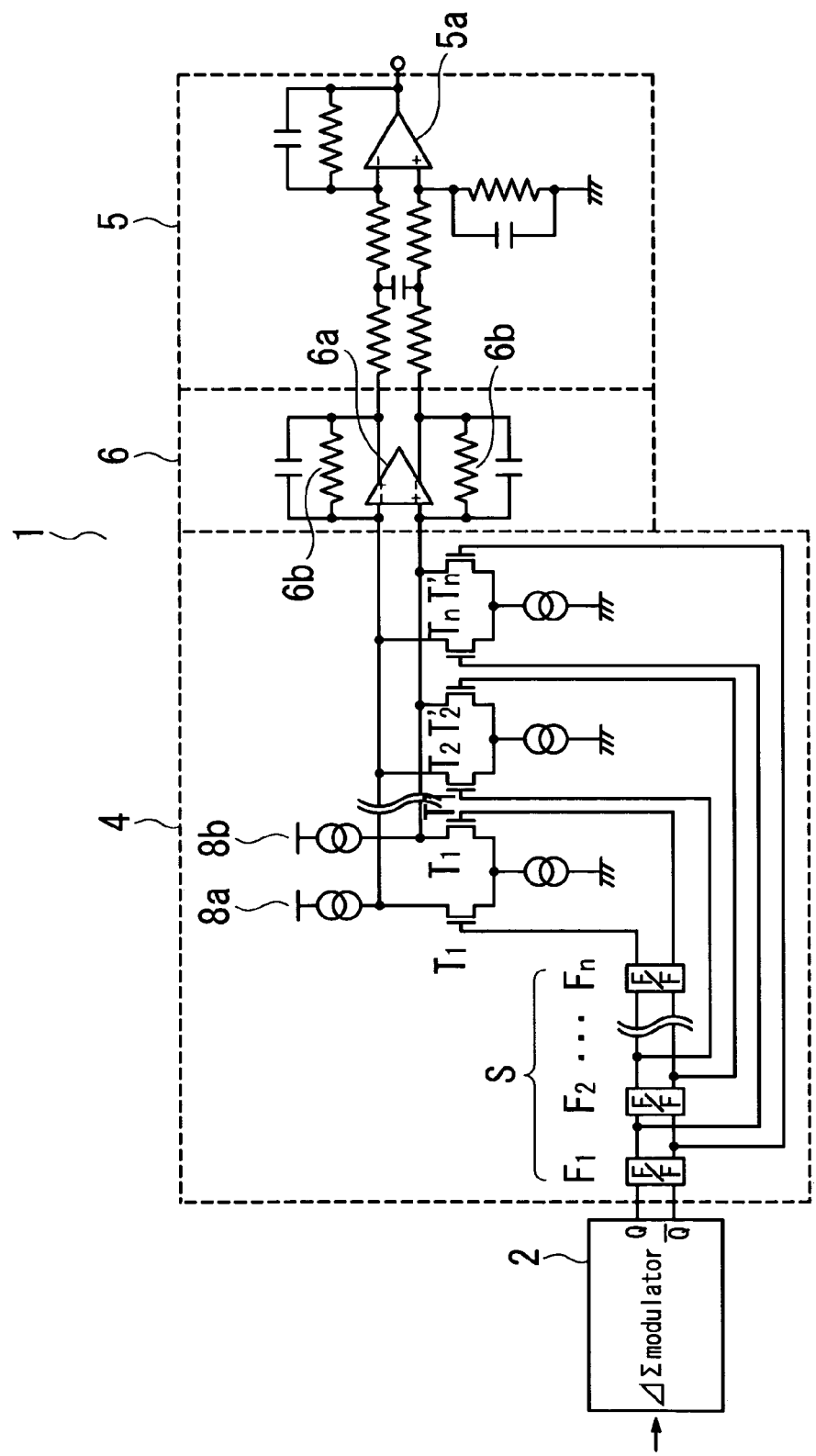
FIG. 1 is a circuit diagram of an output filter for a delta sigma modulator according to the first embodiment of the present invention.
Figure 2:
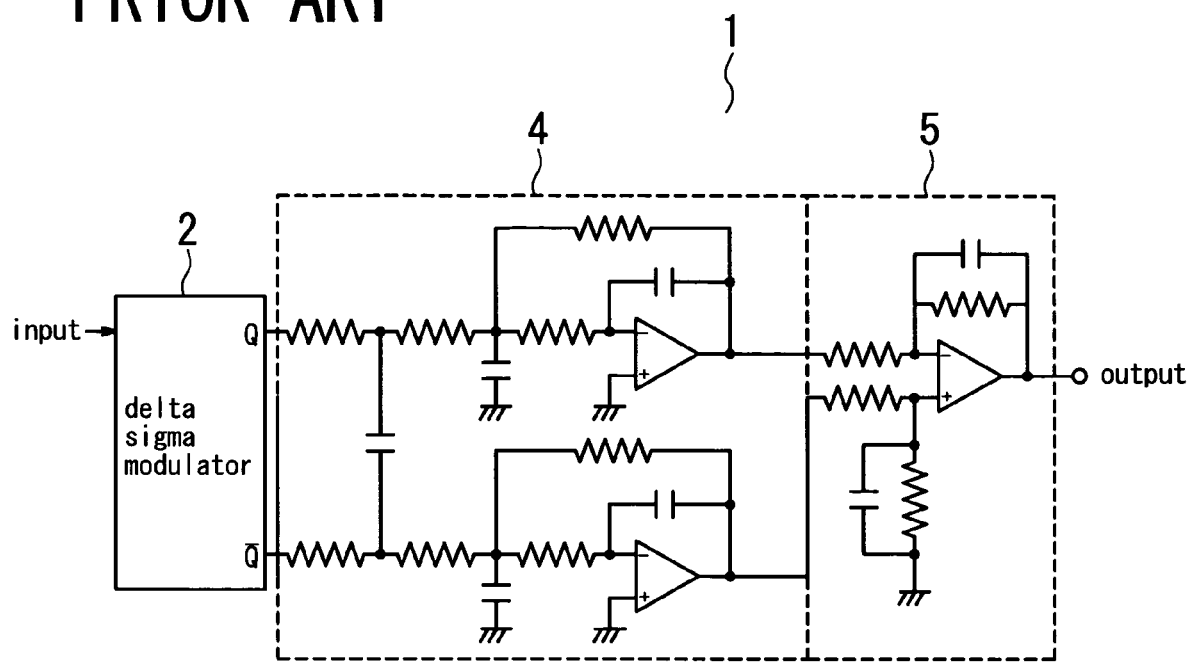
FIG. 2 is a circuit diagram of an output filter for a conventional delta sigma modulator.
Figure 3:
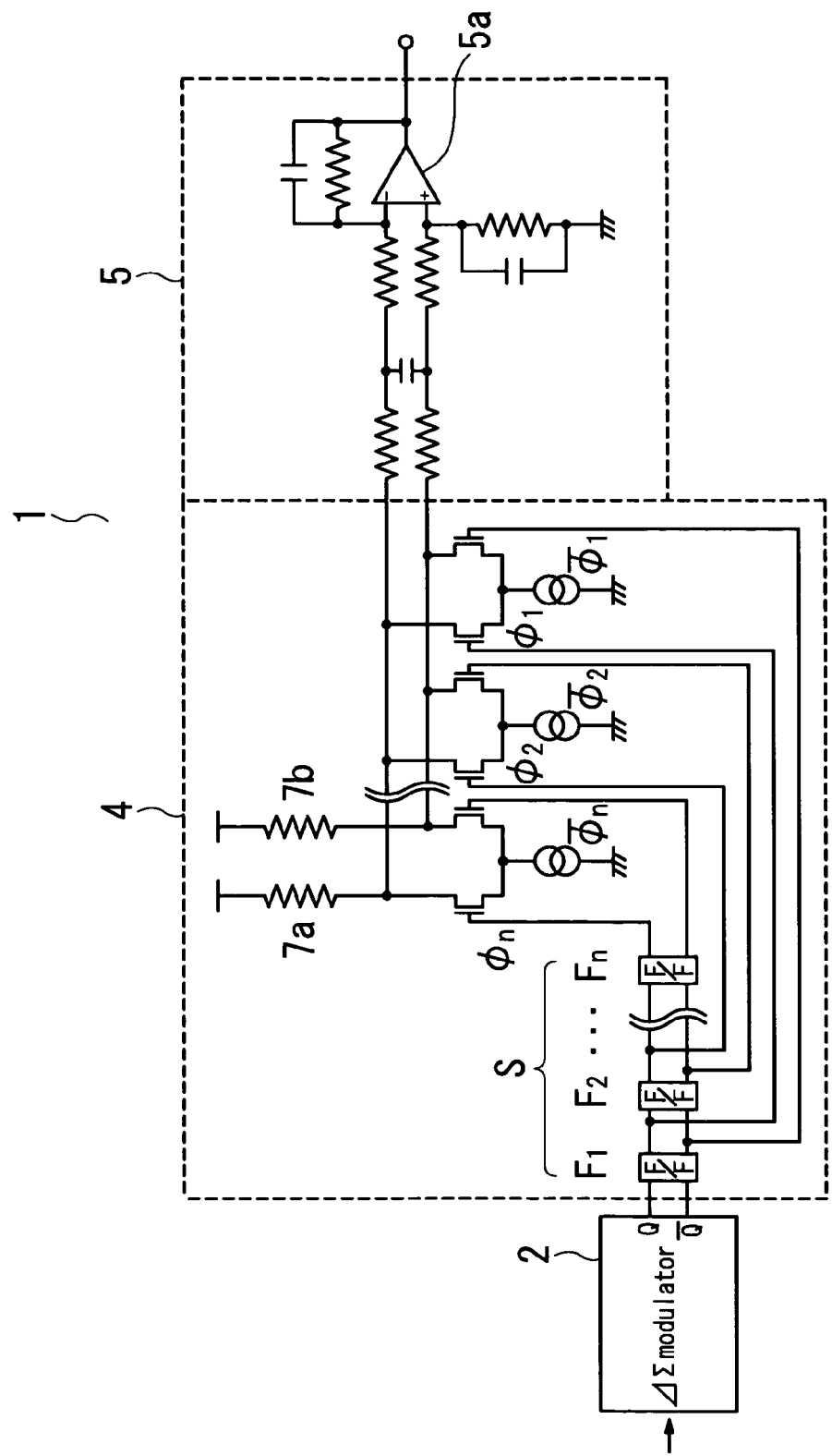
FIG. 3 is a circuit diagram of another output filter for a conventional delta sigma modulator.

FIG. 1 illustrates the first embodiment of an output filter for a delta sigma modulator according to the present invention.

As illustrated in FIG. 1, the output (having experienced D/A conversion) from the delta sigma modulator 2 is inputted to the first stage F/F (F1) of plural flip-flops (F/F) F1, F2, . . . Fn of the shift register S in the FIR filter 4, which is a constituent of the output filter 1. The output data from the delta sigma modulator 2 are delayed by each of the F/F; the Q output and inverted Q output are taken out from each taps to be applied to each control terminals of MOS transistors T1, T1', . . . Tn, Tn', which are cascaded to constant current sources.

The MOS transistors T1, T1', . . . Tn, Tn' control the conduction of currents from the constant current sources 8a and 8b, on the basis of the Q output and inverted Q output of each of the F/F (F1, F2, . . . Fn). Thus, the current outputs from the constant current sources 8a and 8b are weighted according to the filter coefficients of the FIR filter 4, are added, and are outputted.

The current output from the FIR filter 4 is converted into a voltage by means of a current-to-voltage conversion unit 6, which is composed of a full differential operational amplifier 6a and feedback resistors 6b, 6b connected in reverse polarity to the input and output of the differential operational amplifier 6a. The output stage of the current-to-voltage conversion unit 6 is connected to the output circuit 5 of a LPF configuration, which is made up with a single conversion operational amplifier 5a and an application circuit (attached circuit) including plural resistors as illustrated.

In the above configuration, the output signal from the delta sigma modulator 2, whose high-frequency noises are cut down by the FIR filter 4, is converted into a current. The output current thus obtained is converted into a voltage by means of the feedback resistors 6b, 6b of the full differential operational amplifier 6a of the current-to-voltage conversion unit 6. The reason to employ the full differential operational amplifier 6a in the current-to-voltage conversion unit 6 is to remove common mode noises; since the outputs from the FIR 4 are differentially inputted to the full differential operational amplifier 6a, the common mode noises can be removed efficiently.

The output from the current-to-voltage conversion unit 6 is inputted to the output circuit 5 made up with the single conversion operational amplifier 5a and the application circuit, where the high-frequency components are cut down furthermore, and the output circuit 5 produces the analog output corresponding to the output signal from the delta sigma modulator 2.

As described above, the FIR filter of this invention employs the constant current sources as the current source, and does not employ the resistors for the current-to-voltage conversion as seen in the conventional example, which prevents generation of thermal noises by the resistors. Further, since the output filter employs the single conversion operational amplifier 5a, the gain in the actual circuit can be attenuated by about 6 db in comparison to a usual case, thereby improving the noise characteristic still more.

According to the first aspect of the invention, since the current source operates as an FIR filter, the output filter attains a sharp characteristic to be able to sharply cut down the components in the higher frequency range than needed. And, since the current source making up the FIR filter does not use resistors, the output filter can adjust the FIR only by the current, and can prevent generation of thermal noises by the resistors.

According to the first aspect of the invention, since the output filter performs the current-to-voltage conversion by using the feedback resistors of the operational amplifier, the output filter can reduce the thermal noises generated, to that extent that the resistances thereof are smaller in comparison to the conventional case performed by a resistor circuit; it can also remove the common mode noises by carrying out the current-to-voltage conversion through the full differential operational amplifier.

According to the first aspect of the invention, since the output stage of the output filter is made up with a single conversion operational amplifier, the noise level can be reduced furthermore.

What is claimed is:

1. An output filter for a delta sigma modulator, comprising:

a first and a second constant current source having first and second outputs, respectively;

a FIR filter having a plurality n of delay element arranged in cascade, where n is a whole number greater than two, each element being operative to output data of the delta sigma modulator by controlling currents via n switches from the first and second constant current sources on the basis of each of the output data to thereby generate a plurality of weighted currents that are weighted according to a filter characteristic, the weighted currents being added separately for inverted and non-inverted signals and outputted separately at an output side of the FIR filter; and a current-to-voltage conversion unit, said unit having an input side coupled to the output side of the FIR filter and comprising a full differential operational amplifier and feed back resistors, said amplifier having a pair of inputs, each input coupled to a respective one of each separate output of said FIR filter and having an output side.

2. An output filter for a delta sigma modulator as claimed in claim 1, farther comprising a single differential conversion operational amplifier on the output side of the fall differential operational amplifier.

3. A digital signal processor comprising an output filter for a delta sigma modulator, as claimed in claim 1 or claim 2.

4. An output filter for a delta sigma modulator as claimed in claim 1, wherein each said n delay element comprises a flip-flop and each said n switches comprises a respective pair of MOS transistors.

5. An output filter for a delta sigma modulator as claimed in claim 4, wherein said flip flop generates two outputs and each said output is coupled to a gate of a respective one of the MOS transistors.

6. An output filter for a delta sigma modulator as claimed in claim 1, wherein each said constant current source comprises a common source for generating said plurality of weighted currents.

* * * * *